United States Patent [19]
Lint

[11] Patent Number: 5,253,145
[45] Date of Patent: Oct. 12, 1993

[54] COMPLIANT CANTILEVER SURFACE MOUNT LEAD

[75] Inventor: James D. Lint, San Diego, Calif.

[73] Assignee: Pulse Engineering, Inc., San Diego, Calif.

[21] Appl. No.: 824,985

[22] Filed: Jan. 24, 1992

[51] Int. Cl.$^5$ .............................................. H05K 7/14
[52] U.S. Cl. ..................... 361/400; 361/728; 361/730; 361/807
[58] Field of Search ............... 361/392, 394, 397, 399, 361/400, 404, 406, 408, 417; 174/52.1, 52.5

[56] References Cited

U.S. PATENT DOCUMENTS 3,805,117  4/1974  Hausman ........................... 361/395
4,218,724  8/1980  Kaufman ........................... 361/412

Primary Examiner—Leo P. Picard
Assistant Examiner—Donald A. Sparks
Attorney, Agent, or Firm—Baker, Maxham, Jester & Meador

[57] ABSTRACT

A compliant lead structure for mounting a circuit element to a PC board comprises a support body for supporting a circuit element, a plurality of elongated compliant cylindrical conductive lead members secured at an inner end to the support body and extending outward from the support body substantially perpendicular to a mounting plane of a PC board to which the support body is to be mounted and to a position for surface bonding to a PC board, the lead members having an elongated unrestricted section between the inner end and the outer end for enabling relative movement between the support body and a PC board to which the lead member is bonded, and a lead wire extends from a circuit element on the support body and connected to the lead member.

20 Claims, 1 Drawing Sheet

COMPLIANT CANTILEVER SURFACE MOUNT LEAD

BACKGROUND OF THE INVENTION

The present invention relates to electrical and electronic components, and pertains particularly to an improved compliant surface mount lead for electrical and electronic components.

For many years, electronic circuit boards have been fabricated by interconnecting a plurality of electronic components, both active and passive, on a planar printed circuit (PC) board. Typically, this printed circuit board has comprised an Epoxy/fiberglass laminate substrate clad with a sheet of copper, which has been etched to delineate the conductive paths. Holes were drilled through terminal portions of the conductive paths for receiving electronic component leads, which were subsequently soldered thereto.

More recently, so-called surface mount technology has evolved to permit more efficient automatic mass production of circuit boards with higher component densities. With this approach, certain packaged components are automatically placed at preselected locations on top of a printed circuit board, so that their leads are registered with, and lie on top of corresponding solder pads of the conductive paths. The printed circuit board is then processed by exposure to infrared or vapor phase soldering techniques to re-flow the solder, and thereby establish a permanent electrical connection between the leads and their corresponding conductive paths on the printed circuit board.

The increasing miniaturization of electrical and electronic elements and high density mounting thereof has created increasing problems with electrical isolation and mechanical interconnection. In particular, it creates more difficulty establishing reliable and efficient connection between packaged component lead terminals and PC boards. Presently known interconnect methods severely limit the ability to provide density and reliable electrical and mechanical connection between terminal points and PC boards.

Another problem of the present state of the art is that there is often a mismatch between the coefficients of thermal expansion of components and printed circuit boards. This often results in fatigue failure of the lead attachment to the PC board.

Among the electrical and electronic elements that must be surface mounted on PC boards are bi-filar wound cores used as inductors in circuits. These are preferably connected through some form of header or packaging with suitable terminals. The current technique of surface mounting of these and other similar components is by separate component lead terminals. Recent improvements have been made, such as disclosed in U.S Pat. No. 5,015,981, issued May 14, 1991 to Lint et al, and U.S Pat. No. 5,032,953, issued Jul. 16, 1991 to Carl et al, both assigned to the assignee hereof. These current techniques of mounting are time consuming, difficult to machine assemble, and frequently result in reliability problems.

It is, therefore, desirable that an improved more reliable attachment of electronic components to PC boards be available.

SUMMARY AND OBJECTS OF THE INVENTION

It is the primary object of the present invention to provide an improved lead for attachment of electrical components to PC boards.

In accordance with a primary aspect of the present invention, an electronic header device having a plurality of leads comprises a three dimensional holder of a non-conducting material having a cavity therein for holding an electronic element, a plurality of leads extending from the element to the base, and a plurality of lead terminal mounts on the base holder, and each lead having an end portion wound on one of said lead terminal mounts.

BRIEF DESCRIPTION OF THE DRAWING

The above and other objects and advantages of the present invention will become apparent from the following description when read in conjunction with the accompanying drawings wherein.

DETAILED DESCRIPTION OF A PREFERRED EMBODIMENT

Figure 1:
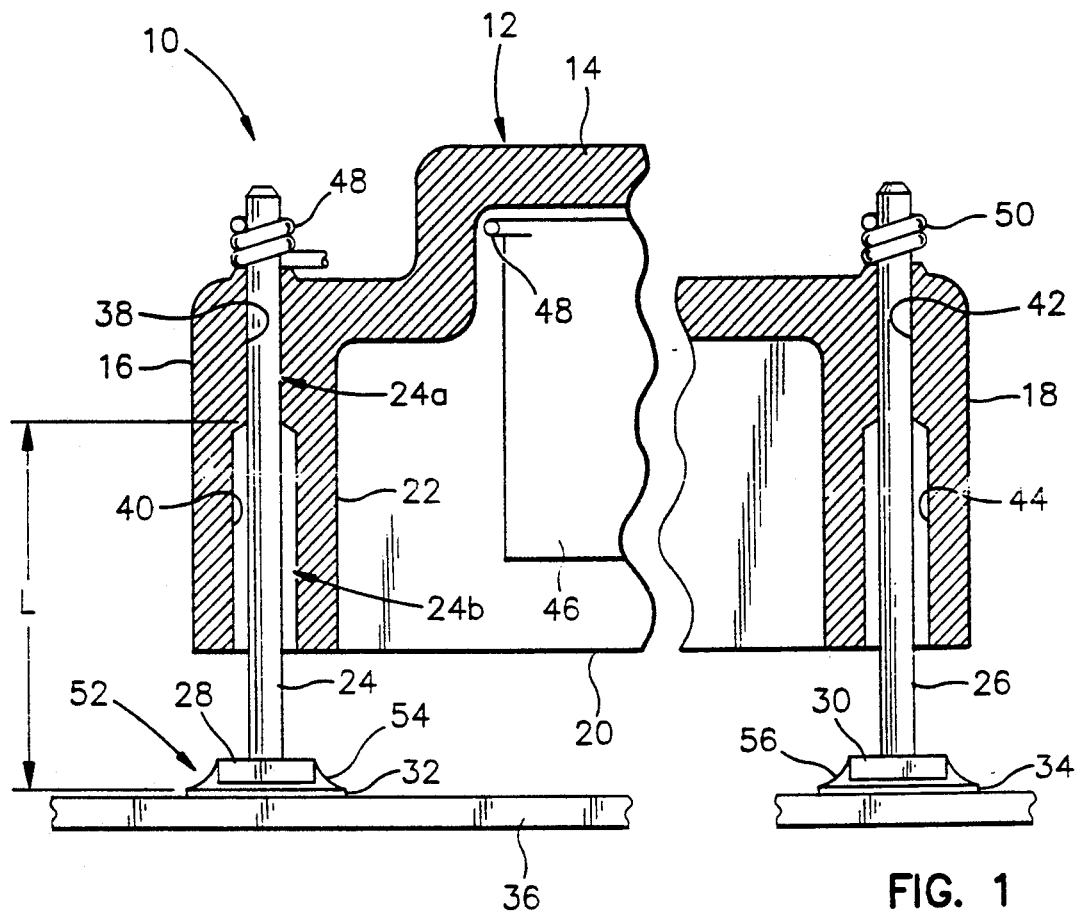
FIG. 1 is an enlarged partial view in section illustrating a preferred embodiment of the invention.

Referring to FIG. 1 of the drawings, an exemplary embodiment of an electronic component package having compliant cantilever surface mount leads in accordance with the invention is illustrated. The overall assembly, designated generally by the numeral 10, comprises a suitable support body or member in the form of a mounting platform or housing 12 for mounting a circuit element. The support member 12 preferably takes the form of a housing, somewhat as illustrated, forming a box-like enclosure having a top wall 14 and downwardly depending sidewalls 16, 18 and 20 forming a downwardly opening chamber 22 in the housing. The housing forms a chamber 22 in which one or more circuit elements are to be mounted.

The support member 12 is provided with a plurality of elongated conductive lead members, two of which 24 and 26 are shown. These lead members, in the illustrated embodiment, are elongated generally cylindrical members having enlarged disc shaped heads 28 and 30 for bonding attachment to bonding pads 32 and 34 on the surface of a PC board 36.

The lead members 24 and 26 are each mounted in stepped diameter bores in the support member or housing 12. More specifically, the lead member 24 is mounted within a stepped bore having a first or smaller diameter section 38 disposed in a remote side furtherest away from a surface mounting side adjacent the surface mount plane of the PC board, and an enlarged bore portion 40 disposed adjacent the surface mount plane. The lead member 26 is similarly mounted in a stepped bore 42, 44. Thus, the elongated lead member is mounted or secured to the housing 12 at a point distant from the surface mount plane of the PC board.

The lead members 24 and 26 are identically mounted, and the lead member 24 will be specifically described. The lead member 24 is mounted by means of press fitting an inner end portion 24a, with a high pressure or force interference fit in the smaller diameter bore portion 38. A maximum interference fit is provided at 24a to optimize mechanical stability and thermal transfer during solder termination and surface mounting solder reflow.

An intermediate section or portion 24b of the member 24 extends along and is enclosed protectively confined in the enlarged portion 40 of the stepped bore. The bore portion 40 is sufficiently larger than the outer diameter of the lead member, so that the intermediate section is unrestricted in lateral or bending movement to enable relative movement between the support body 12 and the PC board. The lead members 24 and 26 have a length to diameter ratio sufficient to support the member 12, yet have adequate compliance. The lead members may be constructed of any suitable conductive lead material, such as copper and copper alloys.

The portion of the lead outside the small bore portion 38 has sufficient length L and compliance or flexibility to enable the PC board 36 and the support member 12 to expand and contract at different rates. The lead members preferably have a symmetric configuration about the longitudinal axis to insure lateral compliance. The compliance is a function of the length to diameter ratio of the lead. This is preferably a minimum of about four or five. The preferred range has been found to be about eight (8) to ten (10) times the diameter for most applications.

This compliance of the leads accommodates any mismatch in thermal coefficient of expansion between the PC board and the support body. Thus, the members can be constructed of quite different materials and any mismatch in the coefficient of expansion accommodated. This enables the use of less expensive materials, such as plastics for forming the support body 12 for supporting the circuit element.

One or more circuit elements 46 having two or more leads 48 and 50 is mounted within the support member or housing 12. The lead 48 is extended to and attached to the lead member 24, such as by wrapping around an extended inner end thereof which projects beyond the outer surface of the support member 12. A similar lead 50 is similarly attached to the lead member 26. The wrapped leads may then be dipped in molten solder to bond them to insure a secure bonded connection.

The support or housing member 12 may be made of any suitable material and contain one or more circuit elements within the chamber 22 thereof. These elements may then be encased within the support housing member by filling the chamber with a suitable sealing material, such as epoxy or the like.

The lead members 24 and 26 extend outward and terminate with the feet or pads 28 and 30 in a surface mounting plane for engagement on lead pads 32 and 34 of a PC board 36. The PC board may be pre-treated with a solder paste, and the pads and lead members bonded at 52 by a suitable reflow process forming a bond by means of a solder at 54 and 56.

Figure 2:
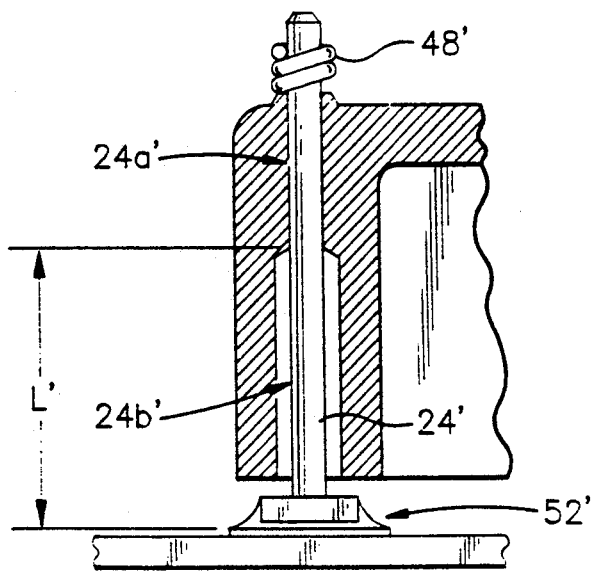
FIG. 2 is a view like FIG. 1 illustrating a minor modification of the embodiment of FIG. 1.

Referring to FIG. 2 wherein like elements are identified by the same reference numeral and equivalent elements are identified by the same number primed, a modification of the FIG. 1 embodiment is illustrated. In this embodiment, the compliant lead member 24' is provided with a short intermediate section, with a length L' prime, such that it extends to a position closely adjacent the bottom edge of the support member 12. This permits a closer mounting of the unit to the PC board.

Figure 3:
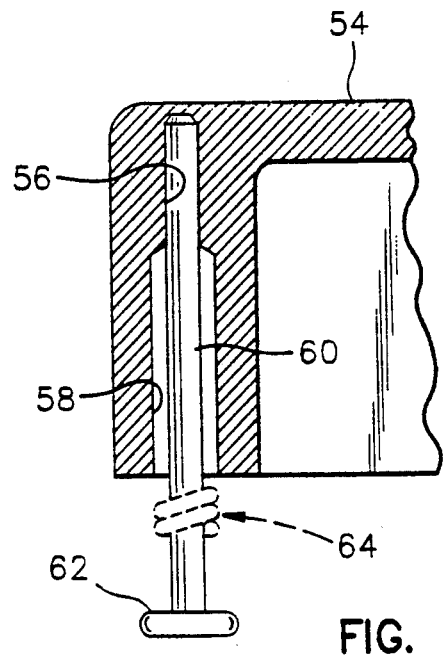
FIG. 3 is a view like FIG. 2 illustrating an alternative embodiment of the invention.

Referring to FIG. 3, an alternate embodiment is illustrated wherein a box-like support housing 54 is provided with a blind step bore having reduced diameter portion 56 and an enlarged diameter portion 58. An elongated conductive lead member 60 is mounted with a press fit of the inner end into the small bore 56, with an intermediate portion thereof encased or enclosed by the larger diameter portion 58. An outer end of the member 60 is provided with a suitable enlarged mounting foot 62 for engagement with and bonding to a pad of a PC board. A lead wire, designated generally at 64, is attached near the outer end of lead member 60 between the support housing and the bonding foot 62.

While I have illustrated and described my invention by means of specific embodiments, it should be understood that numerous changes and modifications may be made therein without departing from the spirit and scope of the invention as defined in the appended claims. I further assert and sincerely believe that the above specification contains a written description of the invention and the manner and process of making and using it, in such full, clear, concise, and exact terms as to enable any person skilled in the art to which it pertains, or with which it is most nearly concerned, to make and use the same, and further that it sets forth the best mode contemplated by me for carrying out the invention.

I claim:

1. A compliant lead structure for mounting a circuit element to a PC board, comprising:

a three dimensional support body supporting a circuit element for mounting on a PC board, said support body having a surface mounting side and a remote side; and having sidewalls extending from said remote side to said mounting side;

an elongated compliant combined support and conductive lead member secured at an inner end to said remote side of said support body and extending outward from said support body to an outer end at a position outside said support body and beyond said mounting side for surface bonding to a PC board externally of said support body for connecting to the PC board and for supporting said support body in spaced relation to the PC board, said lead member having an elongated unrestricted intermediate section between said inner end and said outer end protectively confined within said sidewalls of said support body for enabling relative movement between said support body and a PC board to which said lead member is bonded; and a lead wire extending from a circuit element on said support body and connected to said lead member.

2. A lead structure according to claim 1 wherein said lead member is substantially cylindrical in configuration.

3. A lead structure according to claim 1 wherein said support body has a plurality of said lead support members extending outward from said base.

4. A lead structure according to claim 3 wherein said lead members extend substantially perpendicular to a mounting plane of a PC board to which said support body is to be mounted.

5. A lead structure according to claim 4 wherein said lead members are substantially cylindrical in configuration.

6. A compliant lead structure for mounting a circuit element to a PC board comprising:

a support body for supporting a circuit element, said body having a stepped cylindrical bore in which said lead member is mounted;

an elongated substantially cylindrical compliant combined support and conductive lead member having an inner end, and intermediate section and an outer end, said inner end of said lead member secured by interference fit in small diameter portion of said bore and said intermediate section protectively enclosed in a large diameter portion of said bore, said lead member extending outward from said support body with said outer end at a position for surface bonding to a PC board for connecting to the PC board and for supporting said support body in spaced relation to the PC board, said lead member having said elongated unrestricted intermediate section between said inner end and said outer end for enabling relative movement between said support body and the PC board to which said lead member is bonded; and a lead wire extending from a circuit element on said support body and connected to said lead member.

7. A lead structure according to claim 6 wherein said inner end of said lead extends to an outer surface of said support body, and said led wire is connected to said lead member at said outer surface.

8. A compliant lead structure for mounting a circuit element to a PC board, comprising:

a support body for supporting a circuit element, said support body having a plurality of stepped cylindrical bores for mounting a plurality of lead members;

a plurality of elongated substantially cylindrical compliant combined support and conductive lead members having an inner end, an intermediate section and an outer end, said inner end of said lead members are mounted by interference fit in a small diameter portion of said bores and said intermediate section is protectively enclosed in a large diameter portion of said bores, said lead members extending outward from said support body to said outer end at a position for surface bonding substantially perpendicular to a PC board for connecting to the PC board and for supporting said support body spaced relation to the PC board, said lead member having an elongated unrestricted intermediate section between said inner end and said outer end for enabling relative movement between said support body and the PC board to which said lead member is bonded; and a lead wire extending from a circuit element on said support body and connected to said lead member.

9. A lead structure according to claim 8 wherein said intermediate section has a length that is between from about five to about ten times the diameter thereof.

10. A compliant lead structure for mounting a circuit element to a PC board, comprising:

a three dimensional support body supporting a circuit element for mounting to a PC board, said body having a surface mounting side and a remote side; and having sidewalls extending from said remote side to said mounted side;

a plurality of elongated compliant cylindrical combined support and conductive lead members secured at an inner end to said remote side of said support body and extending outward from said surface mounting side of said support body substantially perpendicular to a mounting plane of a PC board to which said support body is to be mounted and to an outer end at a position outside said support body and beyond said surface mounting side for surface bonding to a PC board for connecting to the PC board externally of said support body and for supporting said support body in spaced relation to the PC board, said lead members having an elongated unrestricted intermediate section between said inner end and said outer end protectively disposed within said sidewalls of said body for enabling relative movement between said support body and a PC board to which said lead members is to be bonded; and a lead wire extending from a circuit element on said support body and connected to each of said lead members.

11. A compliant lead structure for mounting a circuit element to a PC board, comprising:

a support body for supporting a circuit element, said support body having a plurality of stepped cylindrical bores in which lead members are to be mounted;

a plurality of elongated compliant cylindrical combined support and conductive lead members having an inner end and an outer end, said inner end of said lead members mounted by interference fit in a small diameter portion of said bore and said intermediate section is protectively enclosed in a large diameter portion of said bore, said lead members extending outward from said support body substantially perpendicular to a mounting plane of a PC board to which said support body is to be mounted and to said outer end at a position for surface bonding to the PC board for connecting to the PC board and for supporting said support body in spaced relation to the PC board, said lead members having an elongated unrestricted intermediate section between said inner end and said outer end for enabling relative movement between said support body and the PC board to which said lead members is to be bonded; and a lead wire extending from a circuit element on said support body and connected to each of said lead members.

12. A lead structure according to claim 11 wherein said intermediate section has a length that is between from about five to about ten times the diameter thereof.

13. A lead structure according to claim 11 wherein said inner end of said lead extends to an outer surface of said support body, and said lead wire is connected to said lead member at said outer surface.

14. A lead structure according to claim 11 wherein said inner end of said lead member terminated in said small diameter portion of said bore in said support body, and said lead wire is connected to said lead member at said outer end.

15. A lead structure according to claim 11 wherein said lead member has an enlarged outer and for bonding to a PC board.

16. A circuit element mounting assembly having compliant lead structure for mounting to a PC board, comprising:

a support housing for receiving and mounting a circuit element;

a plurality of stepped cylindrical bores in said support housing;

a plurality of elongated compliant cylindrical combined support and conductive lead members secured at an inner end to said support body by interference fit in a small diameter portion of said cylindrical bores and extending outward from said support body substantially perpendicular to a mounting plane of a PC board to which said support body is to be mounted and to an outer end at a position for surface bonding to a PC board for connecting to the PC board and for supporting said support body in spaced relation to the PC board, said lead member having an elongated intermediate section between said inner end and said outer end, said intermediate section protectively enclosed in a large diameter portion of said bore with sufficient clearance for enabling relative movement between said support body and a PC board to which said lead member is bonded; and a lead wire extending from a circuit element on said support body and connected to said lead member.

17. A lead structure according to claim 16 wherein said intermediate section has a length that is between from about five to about ten times the diameter thereof.

18. A lead structure according to claim 16 wherein said inner end of said lead extends to an outer surface of said support body, and said lead wire is connected to said lead member at said outer surface.

19. A lead structure according to claim 16 wherein said inner end of said lead small diameter portion of said bore in said support body, and said lead wire is connected to said lead member at said outer end.

20. A lead structure according to claim 16 wherein said lead member has an enlarged outer end for bonding to a PC board.

* * * * *